US009401196B1

(12) United States Patent
Juvekar et al.

(10) Patent No.: US 9,401,196 B1
(45) Date of Patent: Jul. 26, 2016

(54) DUAL MODE FERROELECTRIC RANDOM ACCESS MEMORY (FRAM) CELL APPARATUS AND METHODS WITH IMPRINTED READ-ONLY (RO) DATA

(71) Applicant: TEXAS INSTRUMENTS INCORPORATED, Dallas, TX (US)

(72) Inventors: Chiraag Juvekar, Cambridge, MA (US); Joyce Kwong, Dallas, TX (US); Clive Bittlestone, Allen, TX (US); Srinath Ramaswamy, Murphy, TX (US); Stephen K. Heinrich-Barna, Lucas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/737,247

(22) Filed: Jun. 11, 2015

(51) Int. Cl.
*G11C 11/22* (2006.01)

(52) U.S. Cl.
CPC .......... *G11C 11/221* (2013.01); *G11C 11/2273* (2013.01); *G11C 11/2275* (2013.01)

(58) Field of Classification Search
CPC ............. G11C 11/221; G11C 11/2255; G11C 11/2253; G11C 11/2273; G11C 11/2275; G11C 11/2295; G11C 11/5657; G11C 11/5685
See application file for complete search history.

(56) References Cited

U.S. PATENT DOCUMENTS 5,525,528 A * 6/1996 Perino ............... H01L 27/11502 257/E21.664
5,745,403 A * 4/1998 Taylor .................... G11C 11/22 365/145
5,953,245 A * 9/1999 Nishimura ........... G11C 11/005 365/145
7,729,156 B2 * 6/2010 Rodriguez ............. G11C 29/50 365/145
2004/0190322 A1 9/2004 Baumann

OTHER PUBLICATIONS

Yinglei Wang, "Hiding Information in Flash Memory", Proceedings of the 2013 IEEE Symposium on Security and Privacy, May 19, 2013, pp. 271-285; IEEE Computer Society Washington, DC, USA; ISBN: 978-0-7695-4977-4.

* cited by examiner

*Primary Examiner* — Andrew Q Tran
(74) *Attorney, Agent, or Firm* — John R. Pessetto; Frank D. Cimino

(57) ABSTRACT

Read-only ("RO") data to be permanently imprinted in storage cells of a memory array are written to the memory array. One or more over-stress conditions such as heat, over-voltage, over-current and/or mechanical stress are then applied to the memory array or to individual storage cells within the memory array. The over-stress condition(s) act upon one or more state-determining elements of the storage cells to imprint the RO data. The over-stress condition permanently alters a value of a state-determining property of the state-determining element without incapacitating normal operation of the storage cell. The altered value of the state-determining property biases the cell according to the state of the RO data bit. The bias is detectable in the cell read-out signal. A pre-written ferroelectric random-access memory ("FRAM") array is baked. Baking traps electric dipoles oriented in a direction corresponding to a state of the pre-written data and forms am RO data imprint.

5 Claims, 11 Drawing Sheets

DUAL MODE FERROELECTRIC RANDOM ACCESS MEMORY (FRAM) CELL APPARATUS AND METHODS WITH IMPRINTED READ-ONLY (RO) DATA

TECHNICAL FIELD

Embodiments described herein relate to semiconductor random access memory ("RAM") and read-only memory ("ROM"), including structures and methods associated with using the same memory cell in two separate modes, random access mode and read-only mode.

BACKGROUND INFORMATION

Electronic RAM has evolved over the years from arrays of discrete, electromagnetic "cores" of ferrite material with magnetizing and sensing windings to semiconductor memory technologies in use today. Current-technology RAM cells may be volatile or non-volatile (the latter referred to as NVRAM) to the extent that they lose the integrity of their contents when power supply rails are de-energized or the cell contents are not periodically re-written ("refreshed"). The latter occurs with dynamic RAM ("DRAM"), in widespread use over the past few decades in the computer industry due to its speed, density and low cost. Newer-technology NVRAM including flash memory and ferroelectric RAM ("FeRAM" or "FRAM") are evolving developmentally in terms of speed, density and cost reduction. The fast evolution of hand-held computing devices including smart phones and tablet computers is a large driving factor in the evolution of NVRAM technologies.

Semiconductor RAM technology has been based largely on memory cells which include capacitance as the basic storage element. Typically a two-dimensional matrix of capacitors or capacitor/transistor pairs forms a memory bit array. A particular capacitor in the array is addressed by row and column driver and/or sense lines. Typically a bit is written by charging the capacitor and the corresponding bit is read by sensing the voltage across the capacitor or by discharging the capacitor and sensing the current flow. In the case of DRAM, a cell capacitor's dielectric material leaks charge quickly after the cell has been written, requiring refresh. In the case of the flash memory type of NVRAM, a high-quality dielectric barrier associated with a floating gate transistor holds electrons pushed across the barrier using a high voltage produced by a charge pump power supply. The charge is maintained indefinitely and thus flash memory is non-volatile at power-off.

In the case of FRAM memory, the capacitor includes a "ferroelectric" fabricated between the plates rather than a dielectric as in the case of a standard capacitor. A characteristic of ferroelectric material such as lead zirconate titanate is that it includes a crystalline lattice of molecules capable of forming and trapping electric dipoles. When the ferroelectric capacitor in an FRAM cell is charged, electric dipoles are aligned in a semi-permanent orientation according to the polarity of a voltage applied across the plates of the capacitor. The dipoles are trapped in that orientation in the crystalline lattice, thus establishing a state in the capacitor that is non-volatile at power-off.

FIG. 1 is a prior-art schematic diagram of a two-transistor, two-capacitor ("2T/TC") single-bit FRAM storage cell 100. The 2T/2C FRAM architecture and its operation will be described and used in examples hereunder. It is noted, however, that some FRAM memory arrays may be fabricated using 1T/1C cells. In the case of 2T/2C architecture, the ferroelectric capacitor associated with each half-cell is normally charged to the opposite polarity of the other half-cell capacitor. At read-out, the read signal is the algebraic difference between the voltages created by the opposite charges on the two half-cells. In general, this difference results in a greater read-out voltage margin than would be available from a 1T/1C storage cell. It is also noted that the description that follows uses the terms "negatively charged" and "storing a logical 0" synonymously when referring to the state of a half-cell so charged. Likewise, the description uses the terms "positively charged" and "storing a logical 1" synonymously when referring to the state of a half-cell so charged. This terminology is used for clarity and convenience. However it is noted that referring to a 2T/2C half-cell as storing a logical state is not entirely correct insofar as a half-cell of a 2T/2C FRAM cell stores a charge and the full 2T/2C cell stores the logical state of the cell as interpreted by the sense amplifier as described below.

In general, the 2T/2C cell operates as follows. The cell is prepared for writing a "1" by presenting a "1" (voltage high) at the cell bit line 103 and closing the write switches 104. First, a logical "0" is written to the right half-cell 105. With the right half-cell bit line 108 low from the negated right half-cell driver 112 and the word line 115 active, the plate line 118 is pulsed high. Doing so applies a negative voltage across the right half-cell capacitor 121 and causes dipoles inside its ferroelectric material to be aligned in a "negative" direction. Next, a logical "1" is written to the left half-cell 125 by reverting the plate line 118 back to ground while the left half-cell bit line 130 is driven high by the left half-cell driver 134. Doing so applies a positive voltage across the left half-cell capacitor 140 and causes dipoles inside its ferroelectric material to be aligned in a "positive" direction. A logical "0" is written to the FRAM cell 100 by reversing the polarities of the above-described operations.

A read operation is accomplished by first pre-discharging both half-cell bit lines 108 and 130. The write switches 104 are opened to leave the two half-cell bit lines 108 and 130 floating. The read switches 145 are closed. The word line 115 is enabled and the plate line 118 is pulsed high. The different polarization charges on the two half-cell capacitors 121 and 140 cause the two bit lines 108 and 130 to settle to different voltages. The voltage differential is sensed at the sense amp 150.

For the example described above of a "1" stored in the left half-cell 125 and a logical "0" stored in the right half-cell 105, the read-out operation applies the same polarities to the right half-cell capacitor 121 as written. Doing so results in only a small charge movement to the right-side bit line 108 and the polarity of capacitor 121 remains as charged during the write operation. However, the read operation reverses the polarity of the left half-cell capacitor 140 and results in a larger charge flow to the left-side bit line 130. The sense amp 150 output swings high, to a "1" state, due to the larger signal on the positive input resulting from the polarity reversal at the left half-cell capacitor 140. Thus, the data bit "1" written to the 2T/2C storage cell 100 in the write sequence described above is read out as a "1" as is expected.

FIG. 2 is a prior-art statistical plot showing distribution curves 205 and 210 for bit line signal voltages 215 during read-out for a number 218 of 2T/2C FRAM half-cells. The read-out voltages represented by the distribution curves 205 and 210 correspond, for example, to the voltages seen on the bit lines 108 and 130 of FIG. 1 during read-out. The voltage differential 220 between half-cells bit lines is sensed by the sense amp 150 of FIG. 1 as described above and determines the margin of accuracy of the read-out data. It is noted that, for the capacitor polarization and corresponding logic levels of the half-cells of the example 2T/2C FRAM cell of FIG. 1, the lower-voltage half-cell voltage distribution curve 205 represents negatively charged half-cells storing a logical "0." The higher-voltage half-cell voltage distribution curve 210 represents positively charged half-cells storing a logical "1." Of course the logic levels may be reversed in some implementations.

Assume, for example, the sense amp 150 input polarities and the storage of a logical "1" in the storage cell 100 as described with reference to FIG. 1. In that case, the curve 205 represents the right half-cell, the curve 210 represents the left half-cell, and the voltage differential 220 is approximately equal to 1.38v−0.54v=+0.84v. A logical "0" stored in the 2T/2C cell 100 of FIG. 1 would result in a voltage differential 220 of approximately −0.84v. The sense amp 150 typically operates like a voltage comparator in that the output state reflects the polarity of the input voltage differential 220.

SUMMARY OF THE INVENTION

Figure 1:
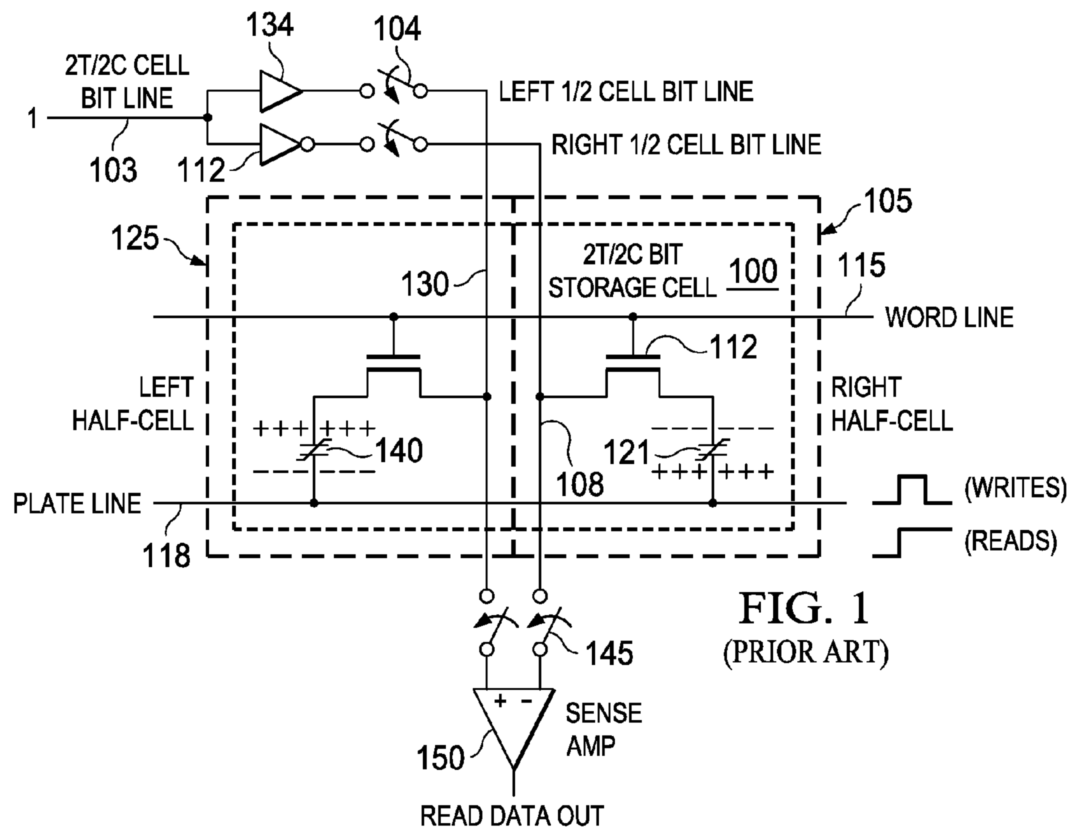
FIG. 1 is a prior-art schematic diagram of a two-transistor, two-capacitor single-bit FRAM data storage cell.

Structures and methods described herein imprint read-only ("RO") data to storage cells of a memory array during manufacturing. As used herein, the term "imprint" means to apply an over-stress condition to one or more state-determining elements of one or more storage cells of the array after the state-determining elements have been set to a selected state. Imprinting permanently biases a value of a state-determining property associated with the state-determining element without incapacitating normal operation of the storage cell. A "state-determining element" as used herein means a structure capable of existing in two or more states and whose logical state determines the state of the storage cell. For example, a state-determining element of a FRAM storage cell is a ferroelectric capacitor. A FRAM capacitor can be polarized positively or negatively by applying a positive or negative voltage across the capacitor. The direction of polarization of the ferroelectric capacitor(s) determines the logical state (e.g., logical "1" or logical "0") of the FRAM storage cell.

A "state-determining property" as used herein is a property of the state-determining element such as an electrical property, a mechanical property, an electromagnetic property, a chemical property, an electro-chemical property, a property of a sub-atomic particle, etc. When altered, the value of a state-determining property biases the cell read-out signal in a detectable way. For example, the state-determining property of a FRAM ferroelectric capacitor is polarization of the ferroelectric material after a polarizing voltage associated with a write operation is removed. A particular charge polarity results when a number of electric dipoles within the ferroelectric layer become aligned in a particular direction according to the polarity of the write voltage applied across the capacitor. The electric dipoles are trapped in the aligned direction within the ferroelectric crystal lattice when the polarizing voltage is removed, leaving a polarization charge on the capacitor. The amount of polarization charge is proportional to the number of trapped dipoles. Thus, for a FRAM storage cell, the state-determining property may be thought of as a polarization charge stored in the ferroelectric layer resulting from its internal aligned electric dipoles. The value of the state-determining property is the post-write amount and direction of plate charge or, in terms of electric dipoles in the ferroelectric layer, the post-write number and direction of aligned dipoles.

An over-stress condition as used herein is a controllable environmental variable such as heat, over-voltage, over-current, mechanical stress applied to a particular point in a particular direction, etc. as applicable to a particular storage cell technology. Embodiments and methods herein intentionally apply an over-stress condition to the storage cell during manufacturing in order to permanently bias the cell state-determining property in a direction corresponding to the cell state at the time that the over-stress condition is applied. Doing so is referred to herein as "imprinting" the cell state as an RO data bit (also "imprinted RO bit" or "imprinted RO data").

Permanently biasing the cell state-determining property by a process-determined amount during imprint does not lock the state-determining property to a set value. The state-determining property continues to be capable of being modified via normal cell write operations. That is, the imprinted cell continues to be capable of read/write ("R/W") operations after being imprinted. However, the bias created during imprinting may be used to access the imprinted RO bit using a special read operation. Thus, each cell of a memory array imprinted as disclosed herein may store two logical bits of information, an R/W bit accessible via normal R/W operations and an imprinted RO bit. The resulting structure is termed "dual mode storage cell" or "dual mode memory cell" and a group thereof is a "dual mode storage array" or "dual mode memory array."

Structures and methods herein disclose data imprint techniques using a 2T/2C FRAM cell as an example technology capable of dual mode operation. However, it is noted that other memory cell technologies which include state-determining elements with state-determining properties capable of being biased via over-stress conditions without precluding ongoing R/W operation are included in the structures and methods described herein.

During normal operation, a bit can be written to a 2T/2C FRAM cell by changing both half-cell states as describe above with reference to FIG. 1. That is, a voltage is applied across the capacitor associated with each half-cell such as to re-align the electric dipoles in the ferroelectric layer of the capacitor. The dipoles remain in the corresponding aligned states in the ferroelectric crystalline layer after the write voltage is removed. However, the FRAM cell may be written to the opposite state by re-applying write voltages of opposite polarity to the capacitors to re-align the electric dipoles in the opposite direction. Thus, the example 2T/2C FRAM cell is capable of R/W operation.

Embodiments and methods herein pre-write an array of 2T/2C FRAM cells to a desired RO state during manufacturing by performing full-cell write operations as previously described with reference to FIG. 1. Heat is then applied to the FRAM cell array during one or more baking cycles. Doing so establishes a permanent charge imprint on the plates of each half-cell by permanently trapping a number of electric dipoles of the ferroelectric layer in their direction of orientation during the baking process. The number of dipoles permanently trapped and thus the permanent charge bias on each half-cell is a function of the baking temperature, duration, number of bake cycles, etc.

The magnitude and polarity of the permanent charge bias results in a read-out voltage for each half-cell that is offset from the read-out voltage of a half-cell in a non-imprinted array when the half-cell is written to a state opposite to the imprinted state. The offset results from the algebraic contribution to the read-out voltage of the subset of electric dipoles permanently trapped in the ferroelectric in the imprinted direction. The imprinted dipoles are incapable of reorienting themselves when an opposite-polarity electric field is applied to the capacitor to re-write the half-cell to the opposite state. The imprinted dipoles thus algebraically subtract from the read-out voltage that would be seen if all available dipoles were to be oriented in the same direction as is the case with a non-imprinted 2T/2C FRAM capacitor half-cell.

It is noted that embodiments and methods herein are described in detail using a 2T/2C FRAM cell array as an example applicable ferroelectric capacitor-based memory architecture. However, similar embodiments and methods may apply to other ferroelectric capacitor-based memory architectures such as 1T/1C FRAM cell arrays and to ferroelectric capacitor-based memory arrays without transistors or other pass devices.

DETAILED DESCRIPTION

Figure 3:
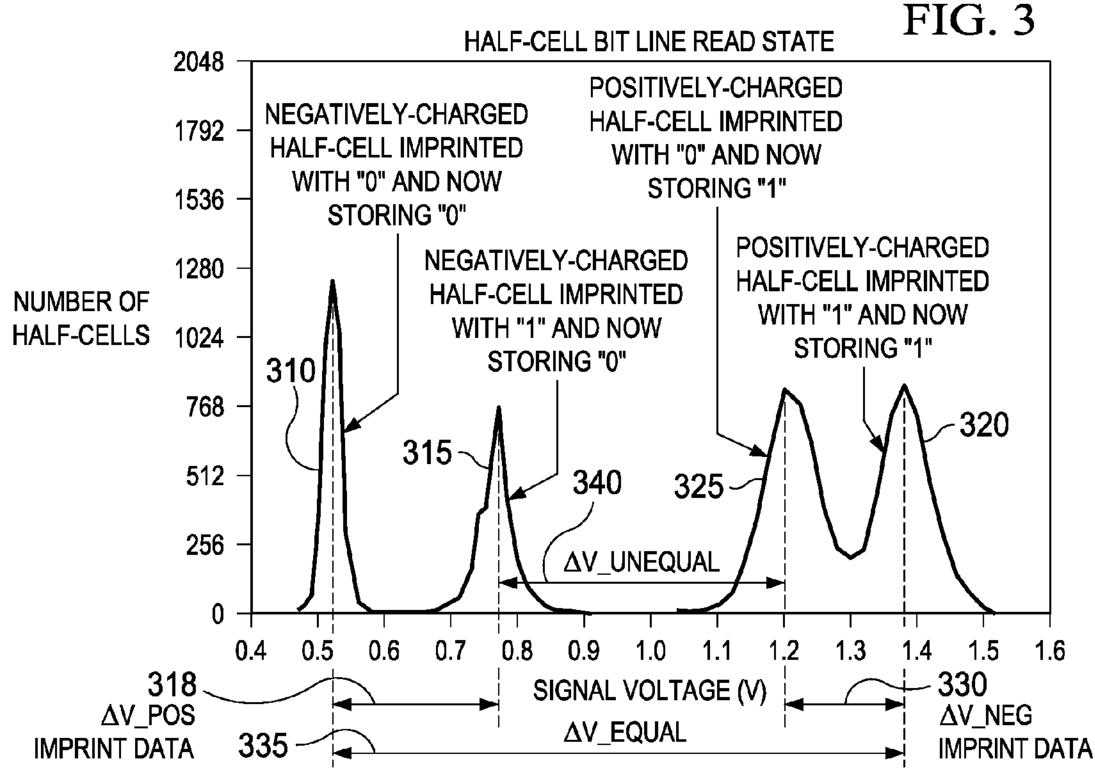
FIG. 3 is a statistical plot showing distribution curves of bit line signal voltages during read-out for a number of 2T/2C FRAM half-cells imprinted with data during manufacturing according to various example methods and embodiments.

FIG. 3 is a statistical plot showing distribution curves 310, 315, 320, and 325 of bit line signal voltages during read-out for a number of imprinted 2T/2C FRAM half-cells. The FRAM cells were imprinted with RO data during manufacturing according to various example methods and embodiments.

Figure 2:
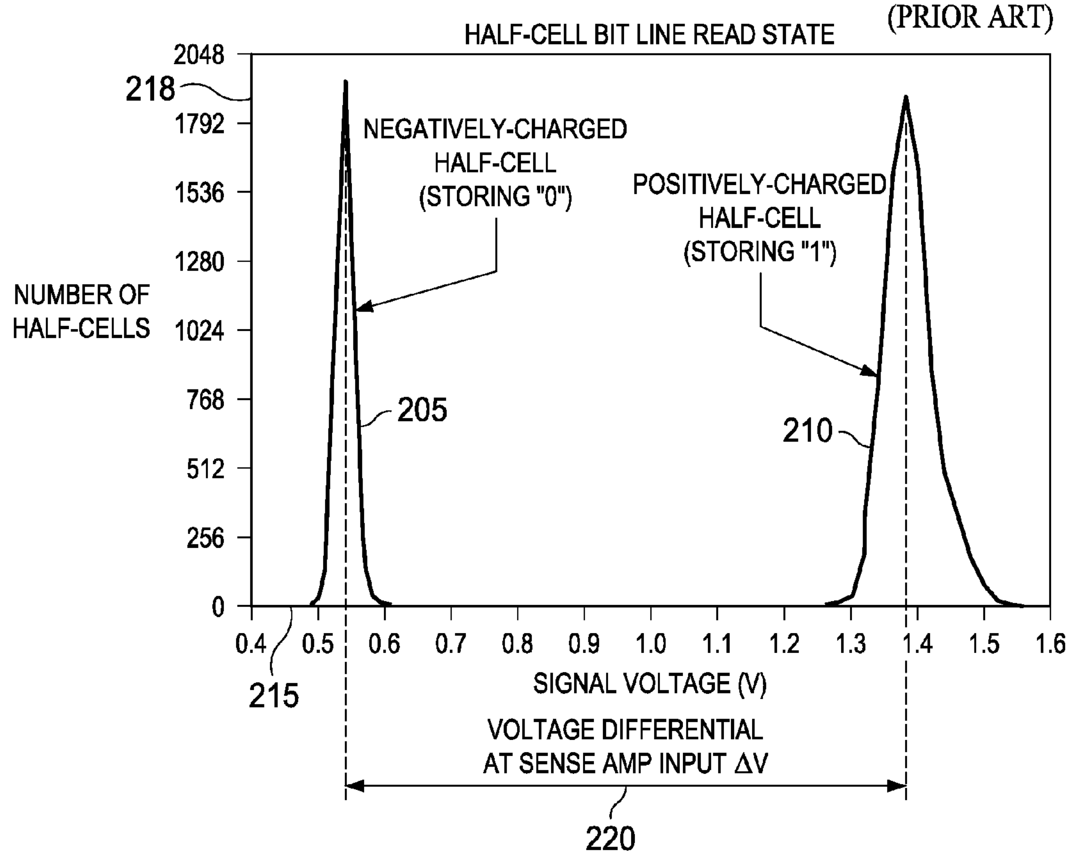
FIG. 2 is a prior-art statistical plot showing distribution curves of bit line signal voltages during read-out for a number of 2T/2C FRAM half-cells.

Curves 310 and 315 illustrate read-out voltages of half-cells currently negatively charged (e.g., half-cells currently storing a logical "0"). Voltages represented by the curve 310 result from half-cells that were imprinted with a logical "0," while voltages represented by the curve 315 were imprinted with a logical "1." The half-cells displaying bit line signal voltages represented by the curve 310 are permanently biased with a negative polarization charge as the ferroelectric material of each of those capacitors contains a certain number of electric dipoles that are permanently trapped in a negatively-oriented direction. The negative bias does not show up in the sense signal voltages 310 for half-cells that are currently negatively charged. The reason is that the ferroelectric dipoles of such negatively-charged half-cells are all negatively oriented anyway as they would be for a non-imprinted negatively charged half-cell such as the half-cells associated with the curve 205 of FIG. 2.

On the other hand, the half-cells displaying bit line signal voltages represented by the curve 315, although currently negatively charged, are permanently biased with a positive polarization charge as the ferroelectric material of each of those capacitors contains a certain number of electric dipoles that are permanently trapped in a positively-oriented direction due to imprint. The imprinted permanent positive polarization charge bias algebraically subtracts from the negative polarization charge that would be present on such half-cells in the absence of imprint. This results in an upward shift in the bit line signal voltages appearing at such cells during read-out by an amount equal to deltaV_POS 318.

Some embodiments herein read the imprinted RO data by performing sequential or simultaneous half-cell writes of a logical "0" to both half-cells of one or more full cells in a 2T/2C FRAM array. Doing so creates the condition in the full cell represented by the curves 310 and 315. That is, regardless of whether a pre-bake full-cell write of a logical "1" or a logical "0" as the full-cell RO data bit was performed, one of the half-cells will have been imprinted with a logical "1" and the other half-cell will have been imprinted with a logical "0" during the bake process. The read sense output voltage from the half-cell imprinted with a logical "0" will be as represented by the curve 310. The read sense output voltage from the half-cell imprinted with a logical "1" will be as represented by the curve 315. These half-cell output voltages will appear as deltaV_POS 318 across the sense amplifier (e.g., the sense amplifier 150 of FIG. 1) during a full-cell read operation immediately following the half-cell writes of all logical "0s."

Using the example case of the 2T/2C cell described with respect to FIG. 1, a full-cell pre-bake RO data bit of "1" would have been written by storing a "0" in the right half-cell 105. The voltage of the curve 310 would therefor appear on the sense line 108 and at the negated input of the sense amplifier 150. The full-cell pre-bake write of a "1" would have stored a "1" in the left half-cell 125. The higher voltage of the curve 315 would therefor appear on the sense line 130 and at the non-negated input of the sense amplifier 150, causing the sense amplifier output to swing high and to therefor reflect the state of the imprinted RO data bit as a "1." A similar explanation substituting opposite polarities results in the read-out of an imprinted "0" RO bit using the example method. The polarity of deltaV_POS 318 reflects the state of the RO data bit. In summary, writing "0s" to all half-cells of a number of full cells from which imprinted RO data is to be extracted and then reading each full cell using a normal full-cell read sequence provides access to the imprinted RO data. It should be noted that writing logical "0s" to both half-cells in a full cell is different from a normal write operation. A normal write operation writes a logical "0" to one half-cell and a logical "1" to the other half-cell.

In similar fashion, curves 320 and 325 illustrate read-out voltages of half-cells currently positively charged (e.g., half-cells currently storing a logical "1"). Voltages represented by the curve 320 result from half-cells that were imprinted with a logical "1" while voltages represented by the curve 325 were imprinted with a logical "0." The half-cells displaying bit line signal voltages represented by the curve 320 are permanently biased with a positive polarization charge as the ferroelectric material of each of those capacitors contains a certain number of electric dipoles that are permanently trapped in a positively-oriented direction. The positive bias does not show up in the sense signal voltages 320 for half-cells that are currently positively charged. The reason is that the ferroelectric dipoles of such positively-charged half-cells are all positively oriented anyway as they would be for a non-imprinted positively-charged half-cell such as the half-cells associated with the curve 210 of FIG. 2.

On the other hand, the half-cells displaying bit line signal voltages represented by the curve 325, although currently positively charged, are permanently biased with a negative polarization charge as the ferroelectric material of each of those capacitors contains a certain number of electric dipoles that are permanently trapped in a negatively-oriented direction due to imprint. The imprinted permanent negative-charge bias algebraically subtracts from the positive polarization charge that would be present on such half-cells in the absence of imprint. This results in a downward shift in the bit line signal voltages appearing at such cells during read-out by an amount equal to deltaV_NEG 330.

Some embodiments herein read the imprinted RO data by performing sequential or simultaneous half-cell writes of a logical "1" to both half-cells of one or more full cells in a 2T/2C FRAM array. Doing so creates the condition in the full cell represented by the curves 320 and 325. That is, regardless of whether a pre-bake full-cell write of a logical "1" or a logical "0" as the full-cell RO data bit was performed, one of the half-cells will have been imprinted with a logical "1" and the other half-cell will have been imprinted with a logical "0" during the bake process. The read sense output voltage from the half-cell imprinted with a logical "0" will be as represented by the curve 325. The read sense output voltage from the half-cell imprinted with a logical "1" will be as represented by the curve 320. These half-cell output voltages will appear as deltaV_NEG 33 across the sense amplifier (e.g., the sense amplifier 150 of FIG. 1) during a full-cell read operation immediately following the half-cell writes of all logical "1s."

Using the example case of the 2T/2C cell described with respect to FIG. 1, a full-cell pre-bake RO data bit of "1" would have been written by storing a "0" in the right half-cell 105. The voltage of the curve 325 would therefor appear on the sense line 108 and at the negated input of the sense amplifier 150. The full-cell pre-bake write of a "1" would have stored a "1" in the left half-cell 125. The higher voltage of the curve 320 would therefor appear on the sense line 130 and at the non-negated input of the sense amplifier 150, causing the sense amplifier output to swing high and to therefor reflect the state of the imprinted RO data bit as a "1." A similar explanation substituting opposite polarities results in the read-out of an imprinted "0" RO bit using the example method. The polarity of deltaV_NEG 330 reflects the state of the RO data bit. In summary, writing "1s" to all half-cells of a number of full cells from which imprinted RO data is to be extracted and then reading each full cell using a normal full-cell read sequence provides access to the imprinted RO data.

Some embodiments thus perform read-out of the imprinted RO data by first writing all half-cells corresponding to full 2T/2C FRAM cells from which imprinted RO data is to be read to the same predetermined state ("pre-read state"), either all logical "1s" or all logical "0s." The immediately-subsequent full-cell read operation performed on each such full cell reflects the imprinted RO data bit associated with the cell.

Some embodiments perform read-out of the imprinted RO data by recognizing the half-cell voltage differential between imprinted cells whose current R/W mode state matches the imprinted RO state and that of imprinted cells whose current R/W mode state is opposite to that of the imprinted RO state. Referring again to FIG. 3, a cell whose current R/W mode state matches that of the imprinted RO data bit generates a voltage differential at the sense amplifier inputs of deltaV_EQUAL 335 during read-out. However, a cell whose current R/W mode state is opposite that of the imprinted RO data bit generates a voltage differential at the sense amplifier inputs of deltaV_UNEQUAL 340 during read-out. Some embodiments herein include dual sense amplifiers. A first sense amplifier is biased to be sensitive to the voltage differential deltaV_EQUAL 335 and to exclude the voltage differential deltaV_UNEQUAL 340. The first sense amplifier is exclusively selected for read-out of R/W data. A second sense amplifier is biased to be sensitive to the voltage differential deltaV_UNEQUAL 340. An OR'd combination of the outputs of the first and second sense amplifiers may be selected for read-out of imprinted RO data.

Figure 4:
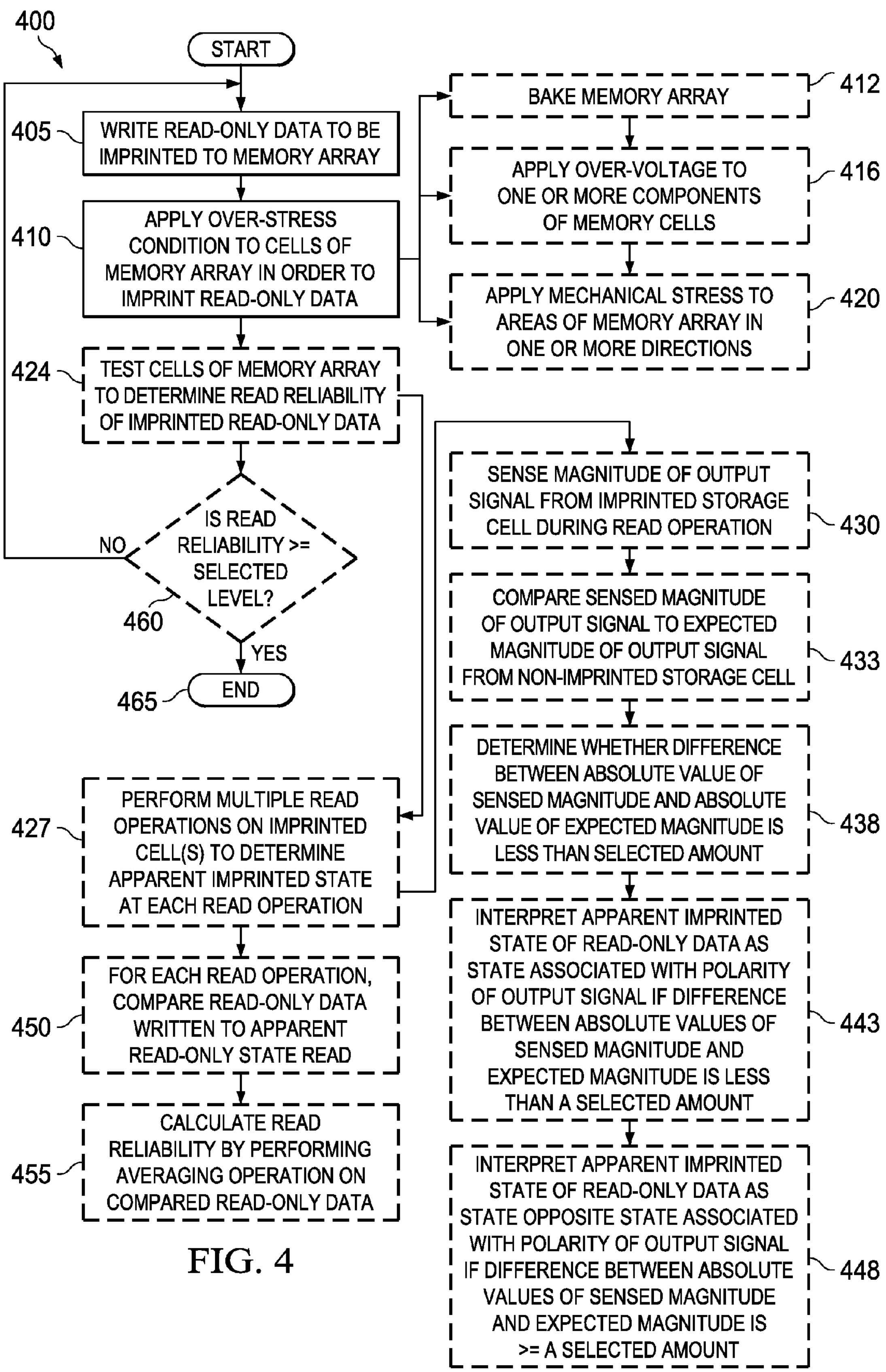
FIG. 4 is a flow diagram illustrating a method of manufacturing a dual mode memory array according to various example sequences.

FIG. 4 is a flow diagram illustrating a method 400 of manufacturing a dual mode memory array according to various example sequences. The dual mode memory array is capable of storing an imprinted RO data bit and a non-imprinted R/W data bit per array storage cell as described generally above. The dual mode memory array may be a FRAM storage cell array or any other memory cell technology capable of having a value of a state-determining property associated with a state-determining element permanently modified and detectable as a bias in the readout signal.

The method 400 commences at block 405 with writing RO data to be imprinted to at least one storage cell of the memory array. The method continues at block 410 with applying one or more over-stress conditions to one or more state-determining elements of the storage cell. Doing so imprints the storage cell with the RO data by permanently modifying a value of a state-determining property associated with the state-determining element. The imprinted RO data is read by detecting a bias in the cell readout signal resulting from the modified value of the state-determining property.

The application of an over-stress condition may include baking the memory array, at block 412. Other examples of applying an over-stress condition include applying an over-voltage or over-current to one or more state-determining components of array memory cells, at block 416, and applying mechanical stress to areas of the memory array in one or more directions, at block 420. Some versions of the method 400 may include over-stress conditions other than those of blocks 412, 416 and 420 or in addition thereto.

Some sequences of the method 400 may also include testing cells of the memory array to determine the read reliability of the imprinted RO data, at block 424. The method 400 may determine imprinted data read reliability by performing operations at blocks 427, 450 and 455. The read reliability sequence of the method 400 commences at block 427 with performing multiple RO mode data read operations on one or more imprinted cells, at block 427. Each read operation is performed by the sequence of blocks 430, 433, 438, 443 and 448 and determines an apparent state of the RO data imprinted in the cell.

RO mode read operations utilize the cell readout signal bias resulting from imprinting the RO data. Permanently biasing the state-determining property associated with one or more of the cell's state-determining elements causes the read-out signal to be biased away from its non-imprinted value if the cell's RO data bit is different from its current R/W data bit, as previously discussed. The magnitude of the bias may be used to determine whether the RO data bit and the R/W data bit match. Thus, the R/W bit read together with a measure of the amount of the readout bias may be used to determine the state of the RO bit.

Each RO mode data read operation of the method 400 commences at block 430 with sensing a magnitude of an output signal associated with the imprinted storage cell during the read operation. The RO read operation continues at block 433 with comparing the sensed magnitude of the output signal of the imprinted storage cell to an expected magnitude associated with an output of a non-imprinted storage cell. The read operation includes determining whether a difference between an absolute value of the sensed magnitude and an absolute value of the expected magnitude is less than a selected amount, at block 438. The read operation also includes interpreting a state of the RO data as a state associated with a polarity of the output signal during the read operation if the difference between the absolute values of the sensed magnitude and the expected magnitude is less than the selected amount, at block 443. The RO read operation further includes interpreting the state of the RO data as a state opposite that associated with a polarity of the output signal during the read operation if the difference between the absolute values of the sensed magnitude and the expected magnitude is greater than or equal to the selected amount, at block 448.

Continuing now with the optional imprinted RO data read reliability test begun at block 424, the method 400 includes comparing the RO data written to the apparent state of the imprinted RO data after each read operation, at block 450. The method 400 also includes calculating a read reliability by performing an averaging operation on the compared RO data, at block 455. The method 400 also includes determining whether an RO data read reliability of the imprinted cell is greater than or equal to a selected level, at block 460. If so, the method 400 terminates at block 465.

If the RO data read reliability of the imprinted cell is less than the selected reliability level, the method 400 may return to block 405 to perform additional RO data write operations, over-stress, and subsequent testing cycles at blocks 405-460 to create a sufficient imprint to result in the desired selected RO read reliability level.

It is noted that error correction coding ("ECC") techniques may be used as an alternative to, or in addition to deepening the imprint to increase RO data read reliability. That is, the RO data may be written with a degree of redundancy to include ECC bits. RO data subsequently read may then undergo ECC decoding to detect and correct bits mis-read due to marginal imprinting of the RO data. Doing so may decrease the depth of imprinting via re-bake cycles that might otherwise be performed during manufacturing to achieve an acceptable post-decoding RO data read reliability.

Figure 5:
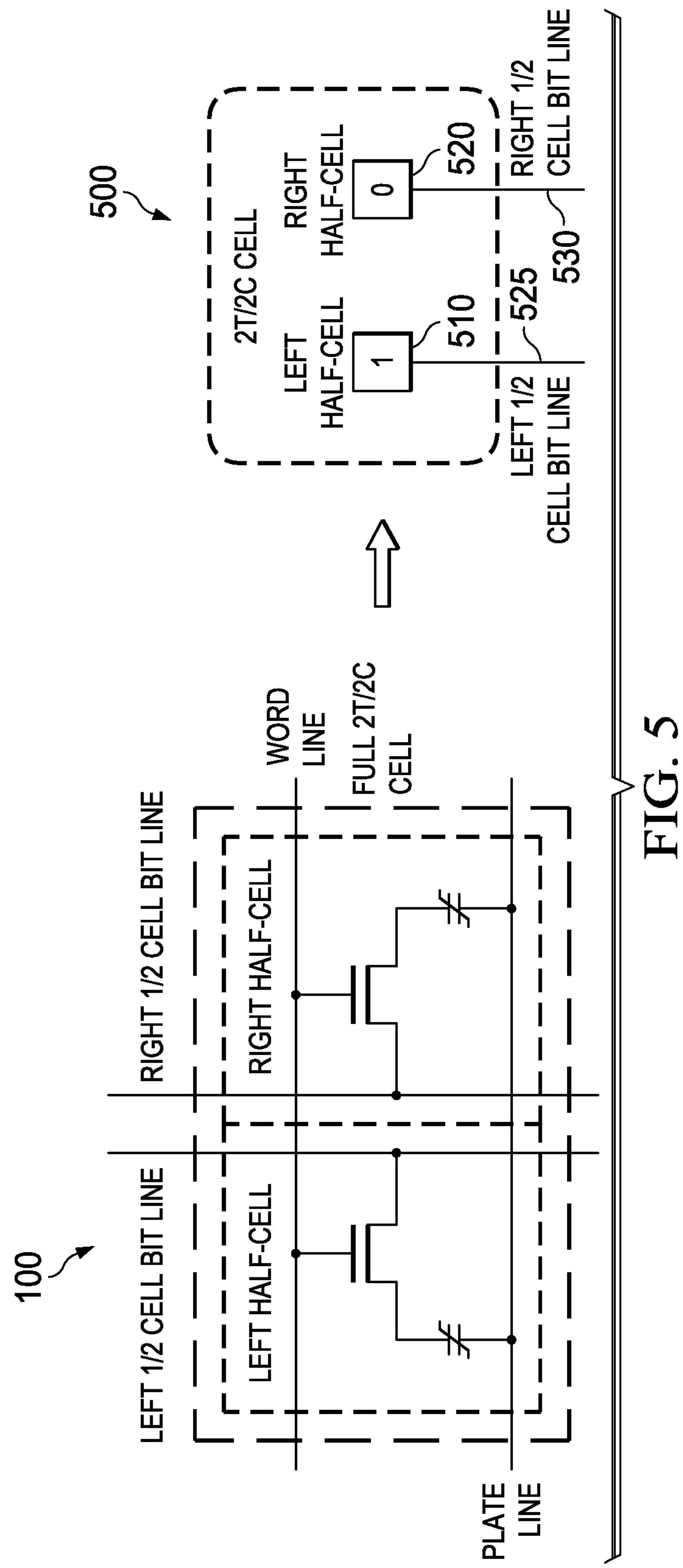
FIG. 5 is a simplified equivalency diagram of a dual mode 2T/2C FRAM cell according to various example embodiments.

FIG. 5 is a simplified equivalency diagram of a dual mode 2T/2C FRAM cell according to various example embodiments. Having reviewed the operation of a more detailed schematic diagram of the 2T/2C FRAM cell 100 of FIG. 1, the abbreviated diagram 500 of the 2T/2C FRAM cell associated with sequences and embodiments herein will be used henceforth for the sake of brevity and clarity. Left and right half-cells 510 and 520 and left and right half-cell bit lines 525 and 530, respectively, are as shown. A positive state of polarization will be shown in a half-cell as a logical "1" and a negative state of polarization as a logical "0." An unknown or "don't care" state will be shown as an "X."

Figure 6:
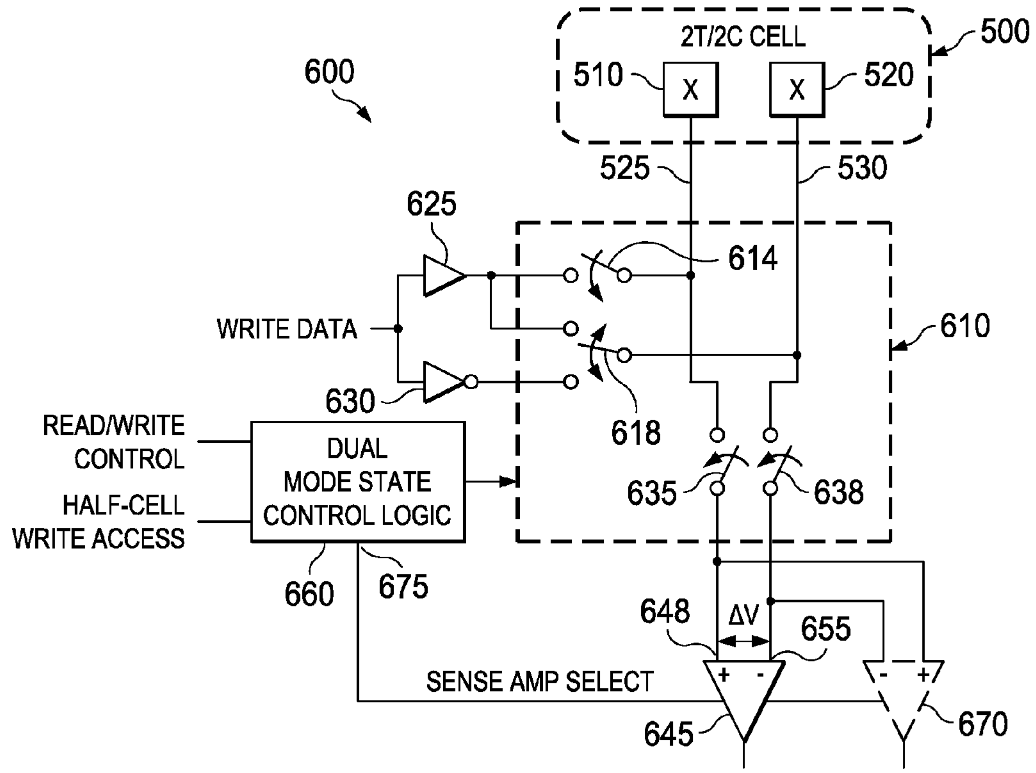
FIG. 6 is a schematic diagram of a dual mode FRAM cell apparatus according to various example embodiments.

FIG. 6 is a schematic diagram of a dual mode FRAM cell apparatus 600 according to various example embodiments. The FRAM cell apparatus 600 includes an array of FRAM storage cells 500, each FRAM cell consisting of two half-cells 510 and 520 (2T/2C). The apparatus 600 also includes a switching matrix 610 communicatively coupled to each FRAM storage cell 500. The switching matrix 610 switches a bit line associated with each half-cell (e.g., the bit line 525 associated with the half-cell 510 and the bit line 530 associated with the half-cell 520). The bit lines 525 and 530 are switched for write and read access to and from the FRAM cell.

The switching matrix 610 includes a first write switch 614 coupled to the bit line 525 and a second write switch 618 coupled to the bit line 530. The apparatus 600 also includes a non-negating write driver 625 coupled to the first and second write switches 614 and 618, respectively. So coupled, the non-negating write driver 625 may write non-negated data to both half-cells 510 and 520 as further described below. The apparatus 600 further includes a negating write driver 630 coupled to the second write switch 618.

The switching matrix 610 also includes a first read switch 635 coupled to the bit line 525 and a second read switch 638 coupled to the second bit line 530. The apparatus 600 also includes a sense amplifier 645 coupled to the first and second read switches 635 and 638. The first read switch 635 is associated with the bit line 525 of the left half-cell 510. So associated, read signals from the left half-cell 510 appear at the non-inverting input 648 of the sense amplifier 645 in this example embodiment of the dual mode FRAM apparatus 600. Likewise, read signals from the right half-cell 520 appear at the inverting input 655 of the sense amplifier 645. These polarities are so-stated merely to maintain consistency of examples herein. It is understood that polarities and logic levels may vary between embodiments without changing the novel nature of structures and sequences herein. The sense amplifier 645 senses a voltage difference between the first and second half-cell bit lines during read operations.

The apparatus 600 also includes dual mode state control logic 660 coupled to the switching matrix 610. The logic 660 controls states of switches associated with the switching matrix 610 to enable full cell read access and both full cell and half-cell write access. The logic 660 also sequences the switches according to a first sequence to perform read operations of R/W data and sequences the switches according to a second sequence to perform read operations of imprinted RO data.

Some embodiments of the dual mode memory apparatus 600 further include a second sense amplifier 670 coupled to the first and second read switches 635 and 638. The second sense amplifier 670 is biased to sense a decreased-level imprint voltage difference between the first and second half-cell bit lines 525 and 530 of an imprinted FRAM cell during a read operation after writing both half-cells 510 and 520 to a same state. An output terminal 675 of the dual-mode state control logic 660 is coupled to the second sense amplifier 670 to select the second sense amplifier 670 when performing an imprinted RO data read operation after writing both half-cells 510 and 520 to the same state.

Figure 7A:
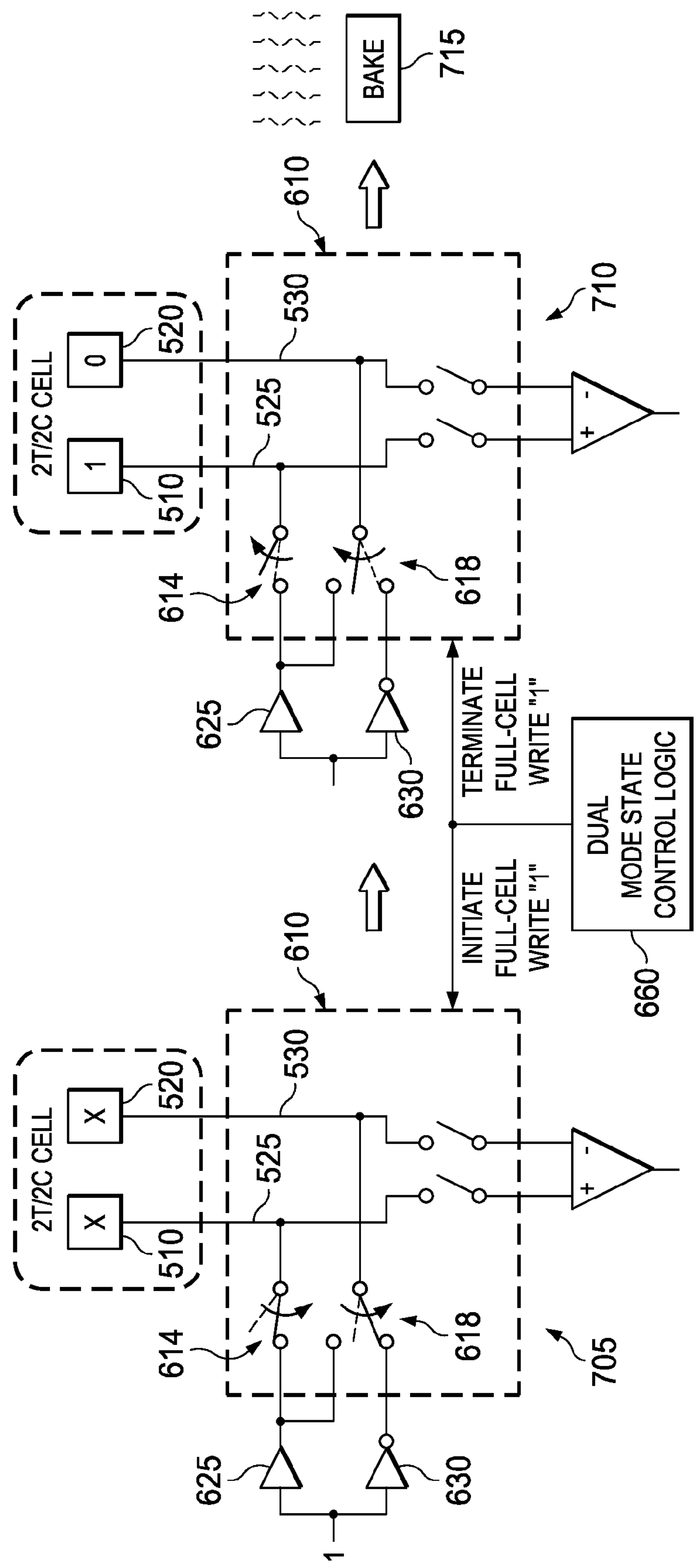
FIG. 7A is a schematic diagram of a dual mode FRAM cell apparatus illustrating bit line control for full-cell write of a logical "1" to be imprinted during manufacturing.

FIG. 7A is a schematic diagram of a dual mode FRAM cell apparatus illustrating bit line control for a full-cell write of a logical "1" to be imprinted during manufacturing. At activity 705, the state control logic 660 initiates a full-cell write of a logical "1" by closing write switch 614 to present an input logical "1" from the non-inverting driver 625 to the bit line 525. The logic 660 also causes a logical "0" to be presented to the bit line 530 by closing bit line switch 618 to the inverting driver 630. At activity 710, the logic 660 terminates the full-cell write operation by opening write switches 614 and 618. The left half-cell 510 then contains a logical "1" and the right half-cell 520 contains a logical "0." The latter the half-cell states correspond to a full-cell logical "1" state. If the preceding example full cell write were to be the last full cell of the FRAM array to be written with RO data, manufacturing may proceed to bake the RO data-written FRAM array to imprint the RO data at activity 715.

Figure 7B:
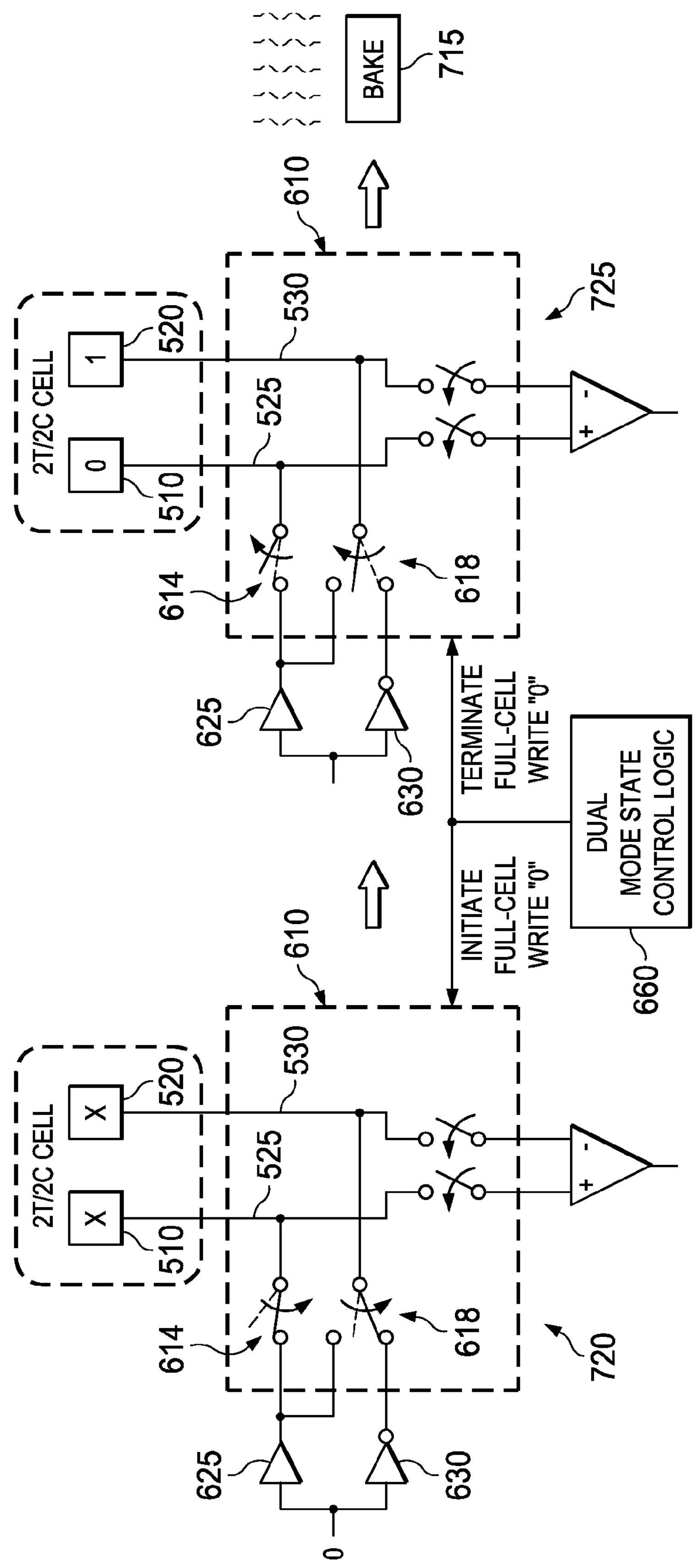
FIG. 7B is a schematic diagram of a dual mode FRAM cell apparatus illustrating bit line control for full-cell write of a logical "0" to be imprinted during manufacturing.

FIG. 7B is a schematic diagram of a dual mode FRAM cell apparatus illustrating bit line control for full-cell write of a logical "0" to be imprinted during manufacturing. At activity 720, the state control logic 660 initiates a full-cell write of a logical "0" by closing write switch 614 to present an input logical "0" from the non-inverting driver 625 to the bit line 525. The logic 660 also causes a logical "1" to be presented to the bit line 530 by closing bit line switch 618 to the inverting driver 630. At activity 725, the logic 660 terminates the full-cell write operation by opening write switches 614 and 618. The left half-cell 510 then contains a logical "0" and the right half-cell 520 contains a logical "1." The latter the half-cell states correspond to a full-cell logical "0" state. If the preceding example full-cell write were to be the last full cell of the FRAM array to be written with RO data, manufacturing may proceed to bake the RO data-written FRAM array to imprint the RO data at activity 715.

Figure 7C:
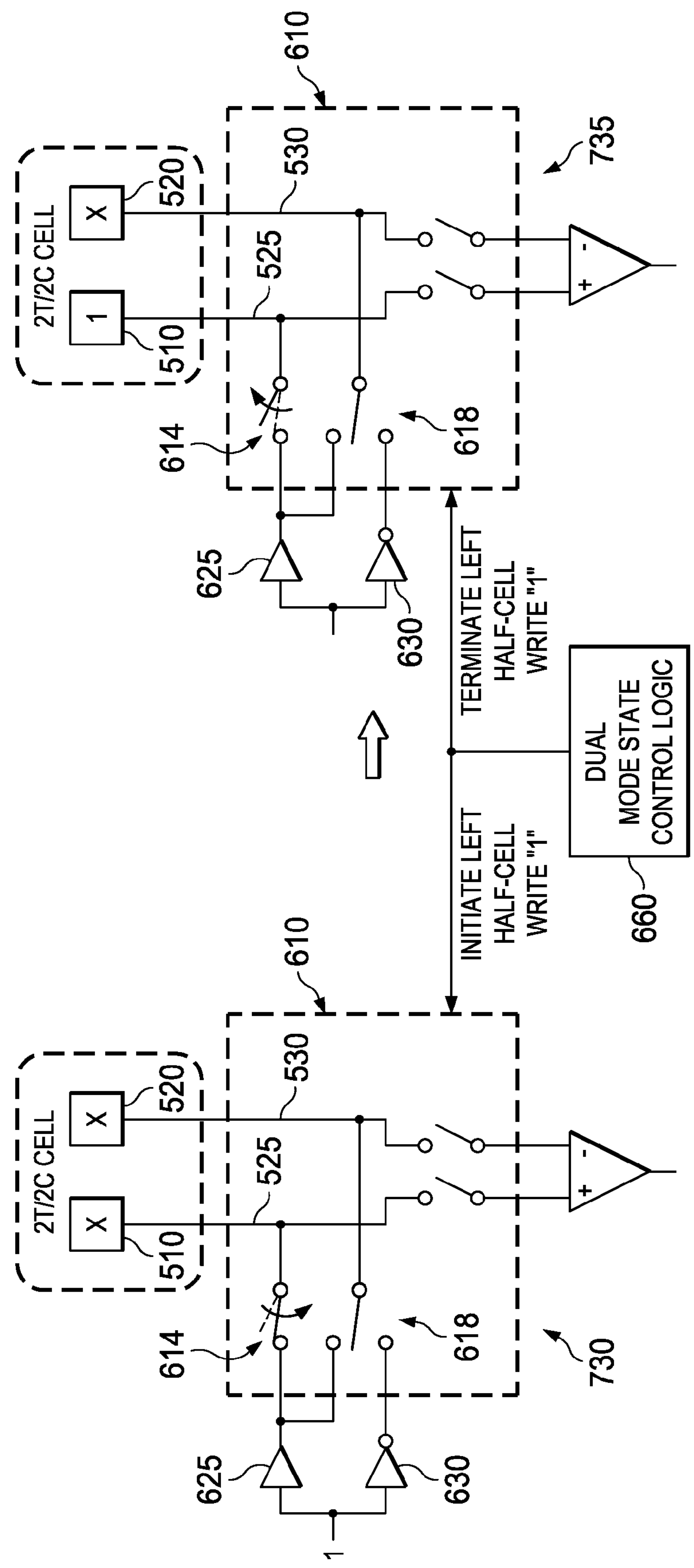
FIG. 7C is a schematic diagram of a dual mode FRAM cell apparatus illustrating bit line control for a left half-cell write of a logical "1" during an imprinted RO mode read operation.
Figure 7D:
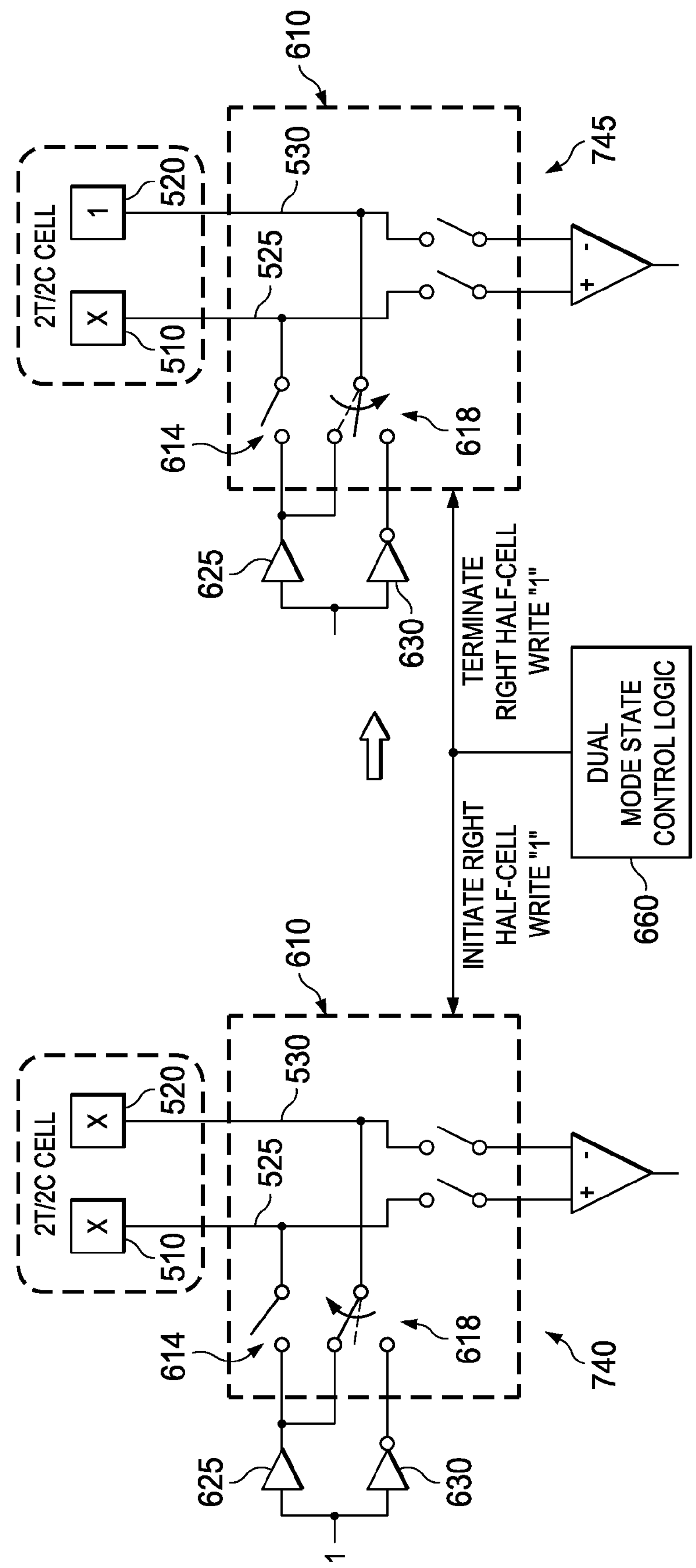
FIG. 7D is a schematic diagram of a dual mode FRAM cell apparatus illustrating bit line control for a right half-cell write of a logical "1" during an imprinted RO mode read operation.
Figure 7E:
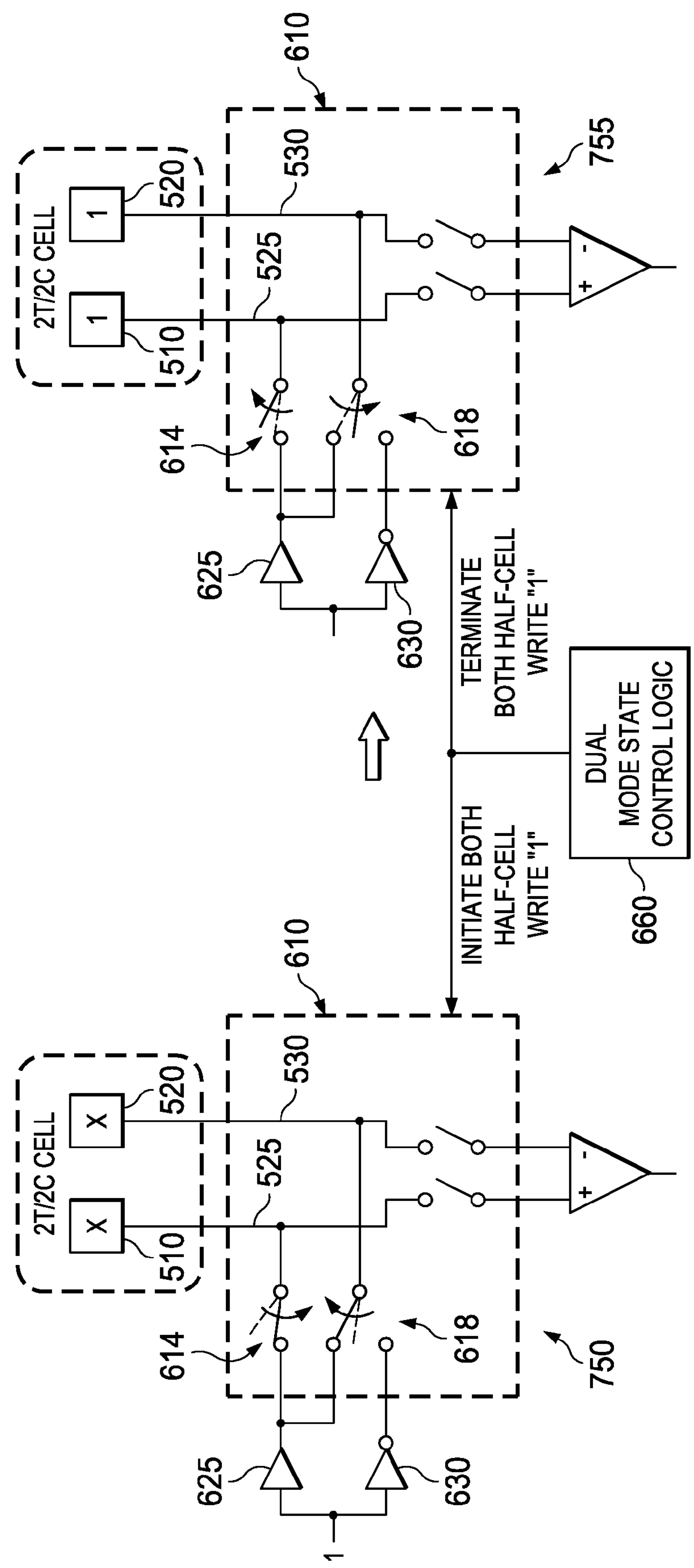
FIG. 7E is a schematic diagram of a dual mode FRAM cell apparatus illustrating bit line control for a simultaneous left and right half-cell write of a logical "1" during an imprinted RO mode read operation.

RO mode reads of the imprinted data may be effected during manufacturing as part of imprint testing as described above. An RO mode read operation of a dual mode 2T/2C FRAM cell is initiated by first writing both half-cells to a logical "1" as described with reference to FIGS. 7C, 7D and 7E. FIGS. 7C and 7D illustrates a method of writing a logical "1" state individually to each half-cell. FIG. 7E illustrates a method of writing a logical "1" state to both half-cells at once.

FIG. 7C is a schematic diagram of a dual mode FRAM cell apparatus illustrating bit line control for a left half-cell write of a logical "1" during an imprinted RO mode read operation. At activity 730, the state control logic 660 initiates a left half-cell write of a logical "1" by closing write switch 614 to present an input logical "1" from the non-inverting driver 625 to the bit line 525. The logic 660 leaves write switch 618 open and thus isolates bit line 530 from the write operation. At activity 735, the logic 660 terminates the left half-cell write operation by opening write switch 614. The left half-cell 510 is set to a logical "1" following the operation.

FIG. 7D is a schematic diagram of a dual mode FRAM cell apparatus illustrating bit line control for a right half-cell write of a logical "1" during an imprinted RO mode read operation. At activity 740, the state control logic 660 initiates a right half-cell write of a logical "1" by closing write switch 618 to the non-inverting driver 625. Doing so presents an input logical "1" from the non-inverting driver 625 to the bit line 530. The logic 660 leaves write switch 614 open and thus isolates bit line 525 from the write operation. At activity 745, the logic 660 terminates the right half-cell write operation by opening write switch 618. The right half-cell 520 is set to a logical "1" following the operation.

FIG. 7E is a schematic diagram of a dual mode FRAM cell apparatus illustrating bit line control for a simultaneous left and right half-cell write of a logical "1" during an imprinted RO mode read operation. At activity 750, the state control logic 660 initiates a full-cell write of a logical "1" by closing write switches 614 and 618 to the non-inverting driver 625. Doing so presents an input logical "1" from the non-inverting driver 625 to the bit lines 525 and 530. At activity 755, the logic 660 terminates the full-cell write operation of logical "1s" to both half-cells by opening write switches 614 and 618. Both half-cells 510 and 520 are set to a logical "1" following the operation.

Figure 7F:
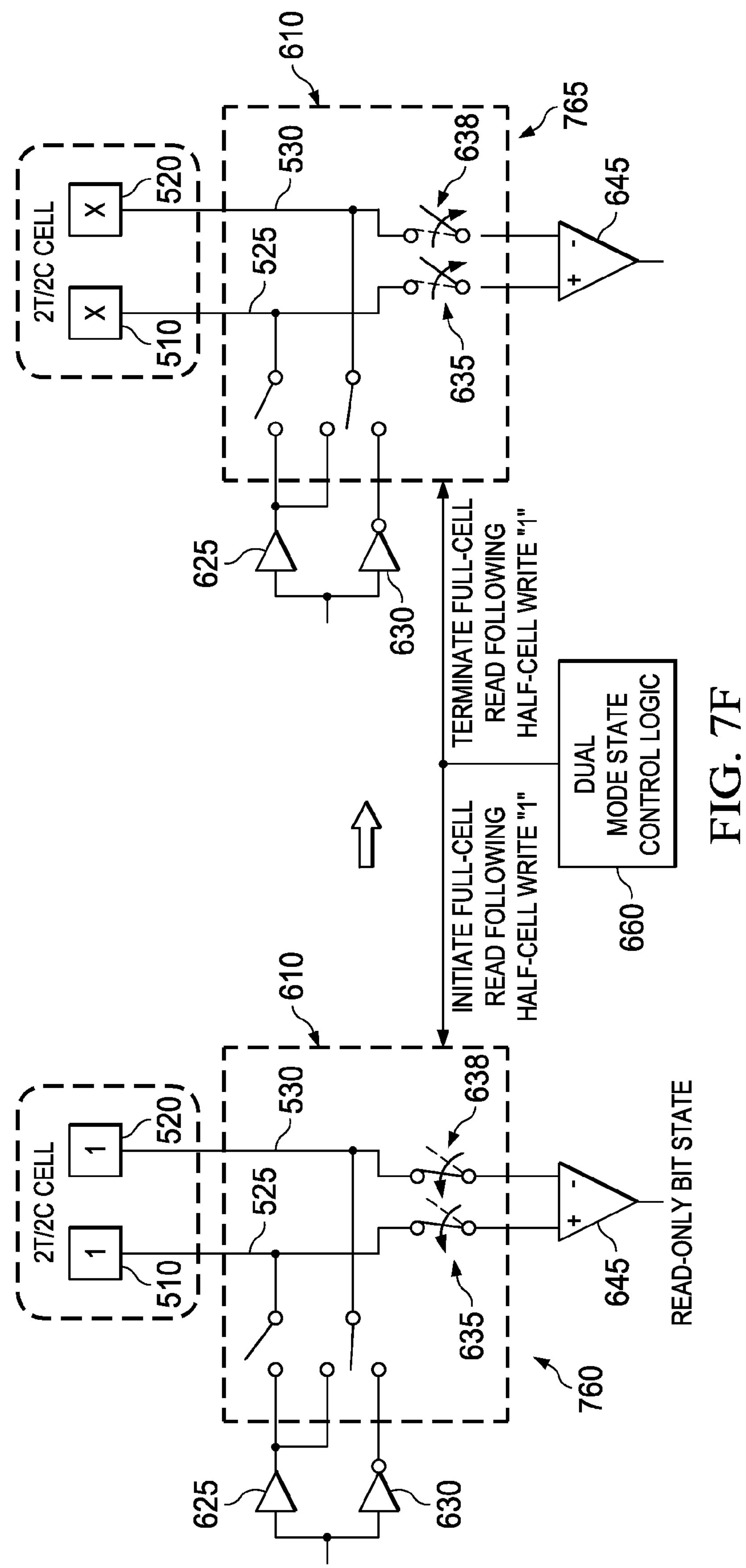
FIG. 7F is a schematic diagram of a dual mode FRAM cell apparatus illustrating bit line control for a full-cell read operation associated with reading an imprinted RO data bit from the cell.

FIG. 7F is a schematic diagram of a dual mode FRAM cell apparatus illustrating bit line control for a full-cell read operation associated with reading an imprinted RO data bit from the cell. At activity 760, the state control logic 660 closes the read switches 635 and 638 to perform a full-cell read operation after having written both half-cells 510 and 520 to a logical "1." The left and right half-cell voltages appear on the bit lines 525 and 530 at the non-inverting and inverting inputs, respectively, of the sense amplifier 645.

The output of the sense amplifier 645 reflects the state of the imprinted RO data bit as described above with reference to FIG. 3. The ferroelectric capacitors of both half-cells are now positively polarized, following the writes of a logical "1" to both half-cells sequentially, as per FIGS. 7C and 7D or simultaneously, as per FIG. 7E. However, one of the half-cells is imprinted with a logical "1" and the other half-cell is imprinted with a logical "0" due to the pre-bake full-cell RO data write during manufacturing. These states are represented by the read state half-cell voltage curves 320 and 325 of FIG. 3.

If the RO data is a logical "1," the left half-cell 510 will be positively biased, as it will be imprinted with a logical "1." However, the imprinted positive bias will not affect the half-cell readout voltage represented by the curve 320. That is because the ferroelectric dipoles of the left half-cell capacitor were oriented in a direction corresponding to a positive polarization charge on the capacitor by the write of a logical "1" preceding the read operation. Continuing with the case of the RO data being a logical "1," the right half-cell 520 will be negatively biased, as it will be imprinted with a logical "0." In that case, the negative imprint will shift the right half-cell readout voltage negatively, reducing it to the bit line readout voltage represented by the curve 325. At the sense amplifier 645, the higher readout voltage 320 on the left half-cell bit line 525 at the non-inverting input will cause the output of the sense amplifier 645 to swing high and to thereby represent the logical "1" RO data bit.

On the other hand, if the RO data is a logical "0," the right half-cell 520 will be positively biased, as it will be imprinted with a logical "1." However, the imprinted positive bias will not affect the half-cell readout voltage represented by the curve 320. That is because the ferroelectric dipoles of the right half-cell capacitor were oriented in a direction corresponding to a positive polarization charge on the capacitor by the write of a logical "1" preceding the read operation. Continuing with the case of the RO data being a logical "0," the left half-cell 510 will be negatively biased, as it will be imprinted with a logical "0." In that case, the negative imprint will shift the left half-cell readout voltage negatively, reducing it to the bit line readout voltage represented by the curve 325. The higher readout voltage 320 on the right half-cell bit line 530 at the inverting input of the sense amplifier 645 will cause the output of the sense amplifier 645 to swing low and to thereby represent the logical "0" RO data bit.

Figure 8:
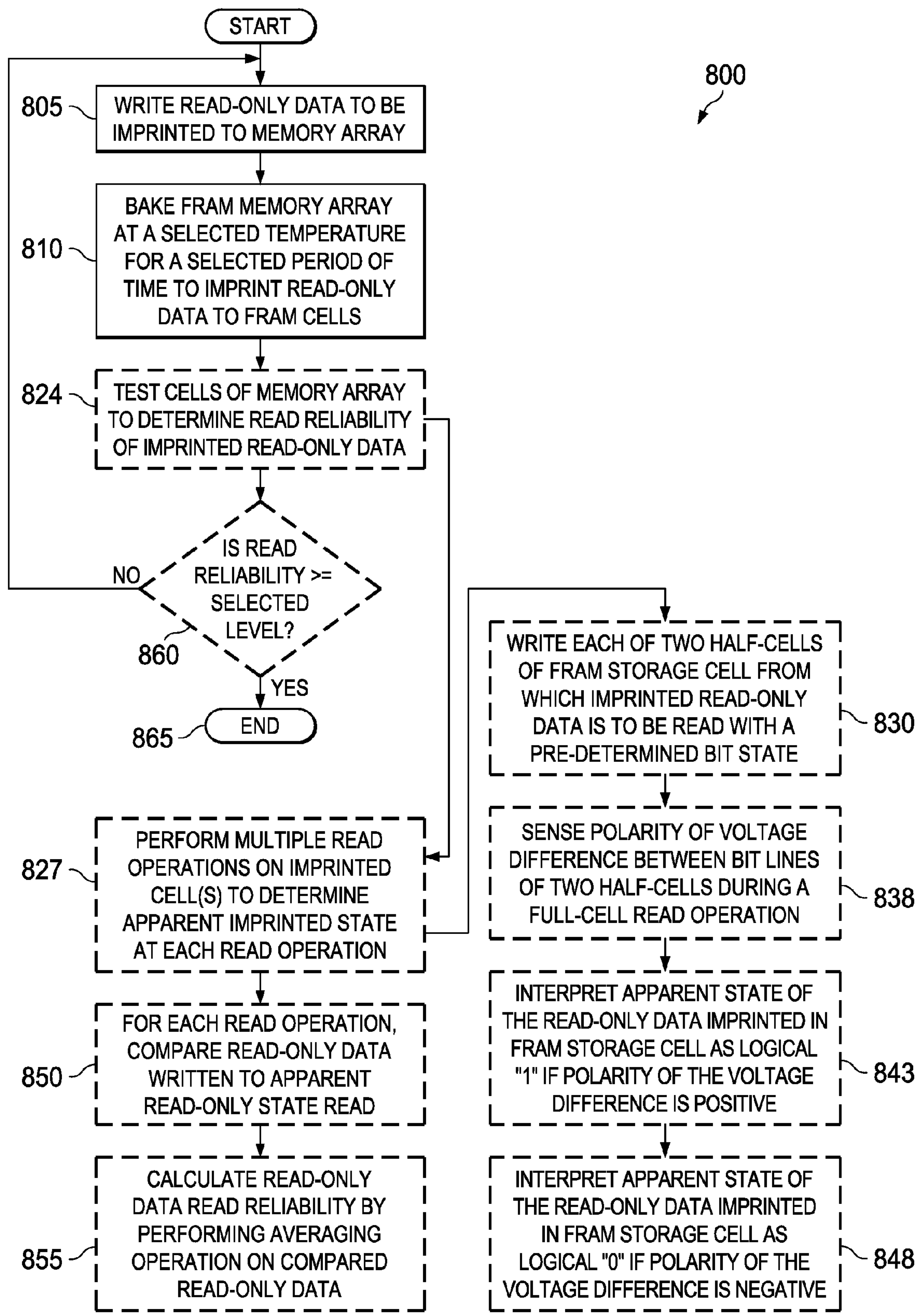
FIG. 8 is a flow diagram illustrating a method of manufacturing a dual mode double cell (2T/2C) FRAM memory array according to various example sequences.

FIG. 8 is a flow diagram illustrating a method 800 of manufacturing a dual mode double cell (2T/2C) FRAM memory array according to various example sequences. The FRAM memory array is capable of storing an imprinted RO data bit and a non-imprinted R/W data bit per array storage cell. The method 800 commences at block 805 with performing full-cell writes of RO data to be imprinted to storage cells of the FRAM memory array. The method 800 continues at block 810 with baking the FRAM memory array at a selected temperature for a selected period of time to imprint the RO data to the storage cells.

Some sequences of the method 800 may also include testing the FRAM memory array to determine the read reliability of the imprinted RO data, at block 824. An RO data read reliability test procedure commences at block 827 with performing multiple RO mode read operations on one or more imprinted cells. Each such RO mode read operation determines an apparent state of the RO data imprinted in the cell. The term "apparent state" is used here because the actual state of the RO data may be mis-read if the RO data has not been sufficiently imprinted as further described below.

Each RO mode read operation commences at block 830 with writing each of two half-cells of the FRAM storage cell from which the imprinted RO data is to be read with a pre-determined bit state. The pre-determined bit state may be a logical "0" or a logical "1" but should remain consistent for each double half-cell pre-write portion of all RO mode read operations. Some FRAM fabrication technologies may favor using one or the other logical bit state as the "pre-determined" bit state. Doing so may result in a greater average differential voltage at the sense amplifier inputs during the read phase of an RO mode read operation and thus provide better RO mode read operating margins. It is also noted that some RO mode pre-write sequences include performing successive half-cell writes of the pre-determined bit state to each half-cell as described above with reference to FIGS. 7C and 7D. Alternatively, an RO mode pre-write sequence may include performing simultaneous writes of the pre-determined bit state to each half-cell as described above with reference to FIG. 7E.

Each RO mode read operation also includes sensing a polarity of a voltage difference between bit lines of the two half-cells during a full-cell read operation (e.g., using a sense amplifier), at block 838. It is noted that some sequences of the method 800 may select a sense amplifier to use for RO mode read operations that is biased to be more sensitive to the smaller resulting bit line voltage differential. Some sequences of the method 800 may select a sense amplifier to use for RO mode read operations that is biased to the common mode voltage of the resulting bit line voltage differential. The bit line common mode voltage for RO mode reads may be different from the common mode voltage encountered when reading in R/W mode. An RO mode read operation also includes interpreting an apparent state of the RO data bit imprinted in the FRAM storage cell as a logical "1" if the polarity of the voltage difference is positive, at block 843. Likewise, the RO mode read operation includes interpreting the apparent state of the RO data bit imprinted in the FRAM storage cell as a logical "0" if the polarity of the voltage difference is negative, at block 848.

Turning back now to block 850, the RO mode read reliability test procedure includes comparing the RO data written to the apparent state of the imprinted RO data as read after each RO mode read operation. The RO mode read reliability test procedure also includes calculating an RO data read reliability by performing an averaging operation on the compared RO data, at block 855.

Some sequences of the method 800 may also include determining whether the RO mode data read reliability of the imprinted cell is greater than or equal to a selected level, at block 860. If so, the method 800 terminates at block 865. If not, the method 800 may return to block 805 to perform one or more additional RO data writing and baking cycles. The method 800 may then proceed to block 824 to perform additional cycles of testing and baking until the RO mode read reliability of the selected number of imprinted FRAM cells is greater than or equal to the selected minimum RO mode read reliability.

It is noted that error correction coding ("ECC") techniques may be used as an alternative to, or in addition to deepening the imprint to increase RO data read reliability, as previously described with respect to the method 400 of FIG. 4. That is, the RO data may be written with a degree of redundancy to include ECC bits. RO data subsequently read may then undergo ECC decoding to detect and correct bits mis-read due to marginal imprinting of the RO data. Doing so may decrease the depth of imprinting via re-bake cycles that might otherwise be performed during manufacturing to achieve an acceptable post-decoding RO data read reliability.

It is also noted that, during post-production operation of a dual mode 2T/2C FRAM memory array, R/W data to be retained should be backed up prior to reading the RO data. The RO data read process is destructive of the R/W data as both half-cells are written to the same state prior to the read operation. The R/W data may be re-written to the array following completion of the RO data read process.

Apparatus and methods described herein may be useful in applications other than dual mode memory cells. The examples of the apparatus 600 and the methods 400 and 800 described herein are intended to provide a general understanding of the structures of various embodiments. They are not intended to serve as complete descriptions of all elements and features of apparatus, systems and methods that might make use of these example structures and sequences.

By way of illustration and not of limitation, the accompanying figures show specific embodiments in which the subject matter may be practiced. It is noted that arrows at one or both ends of connecting lines are intended to show the general direction of electrical current flow, data flow, logic flow, etc. Connector line arrows are not intended to limit such flows to a particular direction such as to preclude any flow in an opposite direction. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense. The breadth of various embodiments is defined by the appended claims and the full range of equivalents to which such claims are entitled.

Such embodiments of the inventive subject matter may be referred to herein individually or collectively by the term "invention" merely for convenience and without intending to voluntarily limit this application to any single invention or inventive concept, if more than one is in fact disclosed. Accordingly, although specific embodiments have been illustrated and described herein, any arrangement calculated to achieve the same purpose may be substituted for the specific embodiments shown. This disclosure is intended to cover any and all adaptations or variations of various embodiments.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. In the preceding Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. The following claims are hereby incorporated into the Detailed Description, with each claim standing on its own as a separate embodiment.

What is claimed is:

1. A dual mode memory apparatus, comprising:

an array of ferroelectric random access memory (FRAM) storage cells, each FRAM cell consisting of two half-cells (2T/2C);

a switching matrix coupled to each FRAM storage cell to switch a bit line associated with each half-cell for write access to the FRAM cell and read access from the FRAM cell; and dual mode state control logic coupled to the switching matrix to control switches associated with the switching matrix to enable full cell read access and both full cell and half-cell write access and to sequence the switches according to a first sequence to perform read operations of read/write ("R/W") data and to sequence the switches according to a second sequence to perform read operations of imprinted read-only ("RO") data.

2. The dual mode memory apparatus of claim 1, the switching matrix further comprising:

a first write switch coupled to a first half-cell bit line of the FRAM storage cell;

a second write switch coupled to a second half-cell bit line of the FRAM storage cell;

a first read switch coupled to the first half-cell bit line; and a second read switch coupled to the second half-cell bit line.

3. The dual mode memory apparatus of claim 2, further comprising:

a non-negating write driver coupled to the first and second write switches; and a negating write driver coupled to the second write switch.

4. The dual mode memory apparatus of claim 2, further comprising:

a sense amplifier coupled to the first and second read switches to sense a voltage difference between the first and second half-cell bit lines.

5. The dual mode memory apparatus of claim 2, further comprising:

a second sense amplifier coupled to the first and second read switches, the second sense amplifier biased to sense an imprint voltage difference between the first and second half-cell bit lines of an imprinted FRAM cell during a read operation after writing both half-cells to a same state; and an output of the dual-mode state control logic to select the second sense amplifier when performing the read operation after writing both half-cells to the same state.

* * * * *